United States Patent [19] [11] 3,731,099
Greene [45] May 1, 1973

[54] BLACK BODY THERMOELECTRIC RADIOMETER

[76] Inventor: Norman D. Greene, Route 1, Box 148, Del Mar, Calif. 92014

[22] Filed: Sept. 30, 1970

[21] Appl. No.: 76,756

[52] U.S. Cl. ....................250/83.3 H
[51] Int. Cl. ....................G01t 1/16
[58] Field of Search ....................250/83.3 H; 73/355 R

[56] References Cited

UNITED STATES PATENTS

| | | | |
|---|---|---|---|
| 3,465,149 | 9/1969 | Flint | 250/83.3 H |
| 3,222,522 | 12/1965 | Birkebak | 250/83.3 H |

*Primary Examiner*—James W. Lawrence
*Assistant Examiner*—Davis L. Willis
*Attorney*—Richard K. MacNeill

[57] ABSTRACT

A black body thermoelectric radiometer in which a heat sink is provided with a conical cavity therein; the cavity walls being lined with a uniform distribution of thin thermoelectric heat flux sensors which directly transduce radiation intensity impinging thereon to an electrical voltage having an amplitude proportional to radiation intensity; the radiation being transferred to heat energy and passing through the thermoelectric heat flux sensors into the surrounding heat sink and an insulative layer surrounding the heat sink; the insulative layer carrying cooling coils therein in heat exchange relationship with the heat sink.

1 Claim, 2 Drawing Figures

INVENTOR.
NORMAN D. GREENE
BY
Richard K. Macneill

BLACK BODY THERMOELECTRIC RADIOMETER

RELATED PATENTS

Ehrlich et al. U.S. Pat. No. 3,464,267

BRIEF DESCRIPTION OF THE INVENTION

The present invention relates to a block body thermoelectric radiometer and more particularly to a black body thermoelectric radiometer which operates at room temperature and requires only conventional water cooling for highest radiation intensities.

According to the invention, a heat sink is provided with a conical cavity therein. The cavity walls are lined with thermoelectric transducers such as that disclosed in U.S. Pat. No. 2,493,651. Radiation impinging upon the walls of the cavity will then be transferred into heat and passed through the thermoelectric liner into the heat sink which is kept at a constant temperature by a circulating coolant. Substantially all of the radiation entering the cavity will pass through the thermoelectric liner in the form of heat. In the preferred embodiment, the ratio of cavity depth to open diameter of at least ten to one achieves a close approximation to a perfect black body. From this design, natural convection effects due to air currents is negligible, hence, no air shielding is necessary.

An object of the present invention is the provision of a black body thermoelectric radiometer for measuring continuous wave or short bursts of energy.

Another object of the present invention is the provision of a black body thermoelectric radiometer which requires no shielding from air currents.

Another object of the present invention is the provision of a black body thermoelectric radiometer which can be operated at room temperature.

A further object of the invention is the provision of a black body thermoelectric radiometer whereby substantially no incident energy is reflected.

Yet another object of the invention is the provision of a black body thermoelectric radiometer which is extremely compact and simple in construction.

Other objects and many of the attendant advantages of this invention will be readily appreciated as the same becomes better understood by reference to the following detailed description when considered in connection with the accompanying drawings in which like reference numerals designate like parts throughout the FIGS thereof and wherein:

FIG 1 is a schematic representation of the preferred embodiment of the present invention; and FIG 2 is a graph showing typical transfer characteristics of the present invention.

DETAILED DESCRIPTION OF THE DRAWINGS

Figure 1:
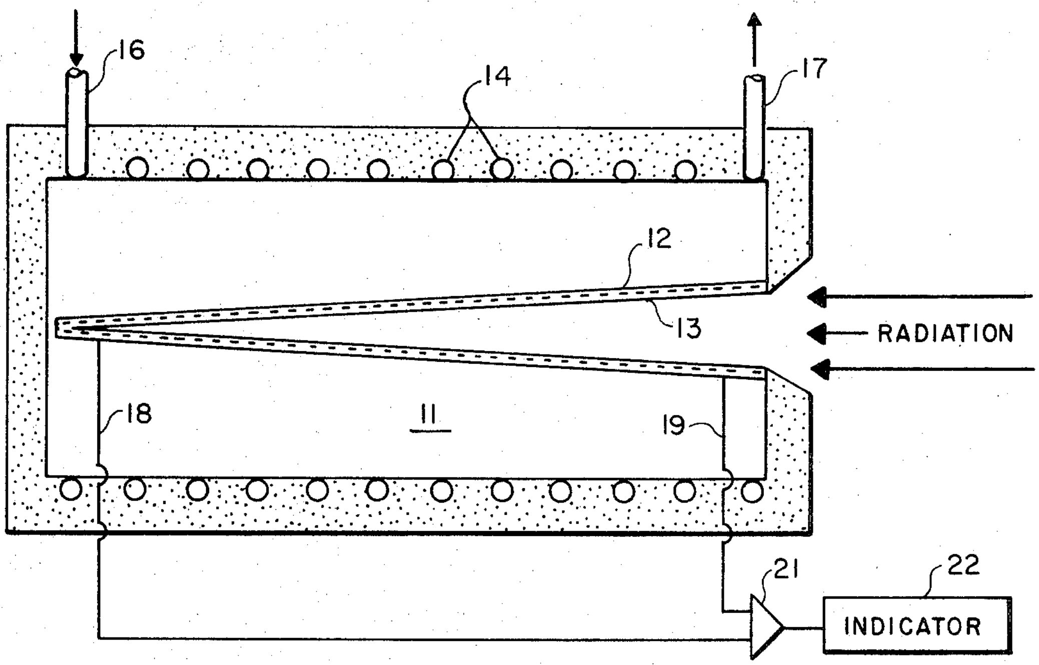

Referring to FIG 1, a heat sink is shown at 11 having a conical cavity 12 lined with thermoelectric transducers 13. Heat sink 12 is surrounded by insulative layer

15 having cooling coils 14 therein with inlet 16 and an outlet 17. Output leads 18 and 19 of thermoelectric transducers 13 are coupled through amplifier 21 to indicator 22.

Figure 2:
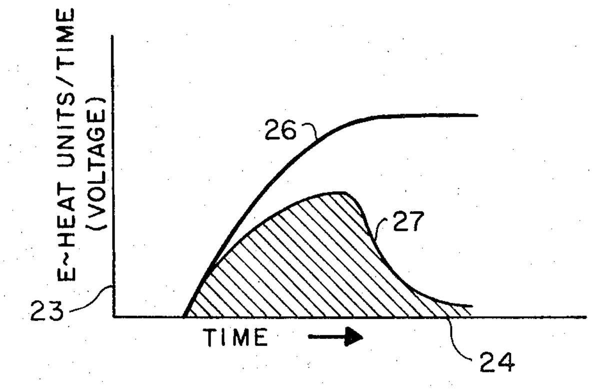

Referring to FIG 2, a vertical axis calibrated in heat per unit time 23 is shown against a horizontal time axis 24. A steady state curve 26 and a transient curve 27 are shown.

OPERATION

Referring back to FIG 1, it can be seen that radiation, as indicated by arrows impinging upon the thermoelectric transducer liner 13 of cavity 12, will be converted into heat and passed through thermoelectric transducer liner 13 into heat sink 11. In applications measuring a high power input radiation, such as in laser beams, a coolant, such as water, would be passed through cooling coils 14 entering at inlet 16 and exiting at outlet 17 for maintaining heat sink 11 at a constant temperature, thereby increasing the accuracy of readings. The heat passing through thermoelectric transducer liner 13 is converted into a voltage having an amplitude proportional to the amount of heat passing therethrough and is coupled to leads 18 and 19 amplified in amplifier 21 and indicated in indicator 22. Indicator 22 can be any conventional read-out equipment, such as a transient recorder equipped with an integrator, etc.

Referring to FIG 2, it can be seen with reference to curve 26, that if a continuous radiation source, such as CW optical or thermal, is impinging upon line 13, a steady-state curve 26 will result which would be calibrated in terms of heat per time unit on vertical axis 23 opposite the time axis 24. In a short burst of energy, the output voltage would resemble that shown at curve 27 which, when integrated over a period of time, would be indicative of the energy deposited in cavity 12.

It should be understood of course that the foregoing disclosure relates to only a preferred embodiment of the invention and that it is intended to cover all changes and modifications of the example of the invention herein chosen for the purposes of the disclosure which do not constitute departures from the spirit and scope of the invention.

The invention claimed is:

1. A black body thermoelectric radiometer comprising:

a heat sink;

a cavity having a ratio of cavity depth to open diameter of at least 10 to 1 within said heat sink, said cavity disposed for impingement of radiant energy thereon; and a plurality of thermoelectric heat flux sensors substantially entirely lining the walls of the said cavity whereby upon the impingement of radiant energy upon said plurality of thermoelectric sensors, radiant energy will be converted into heat and passed into said heat sink.

* * * * *